United States Patent [19]
Saito et al.

[11] Patent Number: 5,189,379
[45] Date of Patent: Feb. 23, 1993

[54] PULSE WIDTH DETECTING CIRCUIT AND PLL SYNTHESIZER CIRCUIT USING THE SAME

[75] Inventors: Shinji Saito, Tajimi; Akira Kobayashi, Kasugai, both of Japan

[73] Assignee: Fujitsu Limited, Kawasaki, Japan

[21] Appl. No.: 918,124

[22] Filed: Jul. 23, 1992

Related U.S. Application Data

[63] Continuation of Ser. No. 614,639, Nov. 16, 1990, abandoned.

[30] Foreign Application Priority Data

Nov. 16, 1989 [JP] Japan .................................. 1-300283

[51] Int. Cl.$^5$ .......................... H03K 5/26; H03L 7/06; H03L 7/18
[52] U.S. Cl. ..................................... 331/1 A; 307/526; 307/234; 328/134; 331/DIG. 2
[58] Field of Search .......................... 331/1 A, DIG. 2; 307/234, 526; 328/133, 134; 329/312

[56] References Cited

U.S. PATENT DOCUMENTS

| | | | |
|---|---|---|---|
| 4,122,405 | 10/1978 | Tietz et al. | 331/1 A |
| 4,408,333 | 10/1983 | Fujii | 375/95 |
| 4,437,072 | 3/1984 | Asami | 331/1 A |
| 4,692,710 | 9/1987 | Shvartsman | 307/234 X |

FOREIGN PATENT DOCUMENTS

| | | |
|---|---|---|
| 0024878 | 3/1981 | European Pat. Off. . |
| 0332467A2 | 9/1989 | European Pat. Off. . |
| 58-11138 | 1/1983 | Japan . |
| 2180708A | 4/1987 | United Kingdom . |

*Primary Examiner*—Siegfried H. Grimm
*Attorney, Agent, or Firm*—Staas & Halsey

[57] ABSTRACT

A PLL synthesizer circuit includes a reference frequency generator for generating a reference frequency signal and a reference clock signal, a phase comparator for comparing a phase of the reference frequency signal with an output signal and for outputting a phase difference signal having a pulse form, and a voltage-controlled oscillation device for generating the output signal having a frequency dependent on the phase difference signal. The PLL synthesizer circuit also includes a phase lock detecting circuit for determining whether or not the phase difference signal has a pulse width in which the reference clock signal successively changes n times (n is numeral equal to or greater than 2) and for outputting a phase lock detection signal representing that the PLL synthesizer circuit is in a phase-locked state when it is determined that the reference clock signal does not successively change n times in the pulse width of the phase difference signal. There is also provided a pulse width detecting circuit suitable for application of a phase lock/unlock detection in a PLL synthesizer.

17 Claims, 11 Drawing Sheets

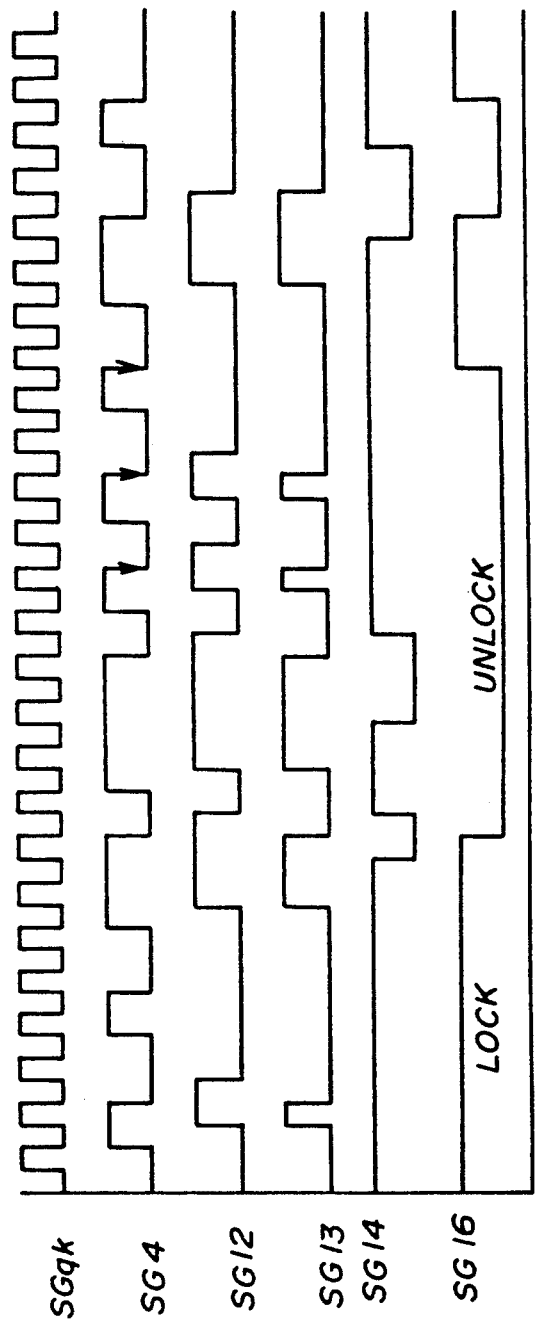

PULSE WIDTH DETECTING CIRCUIT AND PLL SYNTHESIZER CIRCUIT USING THE SAME

This application is a continuation of application Ser. No. 07/614,639, filed Nov. 16,1990, now abandoned.

BACKGROUND OF THE INVENTION

The present invention generally relates to a phase-locked loop (PLL), and more particularly to a circuit for detecting a phase-locked state of a PLL synthesizer circuit. More specifically, the present invention is concerned with a pulse width detecting circuit suitable for detecting the phase-locked state of the PLL synthesizer circuit.

Recently, a PLL synthesizer circuit is widely used in various communication systems. In the field of communication systems, there is a need to provide a digitized phase lock detecting circuit in order to make the PLL synthesizer circuit compact and avoid an adjustment operation thereon.

Referring to FIG. 1, there is illustrated a basic configuration of a PLL synthesizer circuit. A crystal oscillator 1 generates a signal SGl having an inherent frequency based on a vibration of a built-in crystal vibration element. A reference frequency divider 2 receives the signal SG1 and divides the frequency thereof to thereby generate a reference signal SG2 having an appropriate frequency lower than the frequency of the signal SG1. The reference signal SG2 generated and output by the reference frequency divider 2 is input to a phase comparator 3.

FIG. 2 is a circuit diagram of the phase comparator 3. As shown, the phase comparator 3 is composed of NAND circuits $3a$, an inverter $3b$, a P-channel MOS transistor $3c$ and an N-channel MOS transistor $3d$. The phase comparator 3 has two input terminals Ti1 and Ti2, and two output terminals To1 and To2. The reference signal SG2 is applied to the input terminal Ti1, and a signal SG3 generated by a comparison frequency divider 6 is applied to the input terminal Ti2. The reference signal SG2 and the signal SG3 respectively have waveforms as shown in FIG. 3. In response to the reference signal SG2 and the signal SG3, the phase comparator 3 outputs signals SG4 and SG5 to the output terminals To1 and To2, respectively. The signals SG4 and SG5 are based on the phase difference between the reference signal SG2 and the signal SG3. The signal SG4 is input to a phase lock detecting circuit 100, and the signal SG5 is input to a lowpass filter (LPF) 4.

The lowpass filter 4 smooths the signal SG5 of the phase comparator 3 and outputs a direct-current voltage signal SG6, which is then input to a voltage-controlled oscillator (VCO) 5. The voltage-controlled oscillator 5 varies the oscillation frequency of a signal SG7 on the basis of the direct-current voltage of the signal SG6. The signal SG7 is input to the comparison frequency divider 6, which divides the frequency of the signal SG7 and thereby generates the aforementioned signal SG3.

A digitized structure of the phase lock detecting circuit 100 is illustrated in FIG. 4. The reference frequency divider 2 is composed of a plurality of frequency dividers $q_1$–$q_n$ connected in series. The signal SGl generated and output by the crystal oscillator 1 is input to the frequency divider $q_l$ of the first stage. The frequency dividers $q_1$–$q_n$ divide the frequencies of the respective input signals, and generate respective output signals having frequencies equal to $\frac{1}{2}$ of the respective input signals. When the frequency divider $q_k$ generates an output signal SG$q_k$, as shown in FIG. 5, the frequency divider $q_k+1$ generates an output signal SG$q_k+1$ having a frequency equal to half the frequency of the output signal SG$q_k$. In this way, the frequency divider $q_m$ generates an output signal SG$q_m$.

The input terminal Ti1 of the phase comparator 3 is supplied with, as the reference signal SG2, the output signal SG$q_m$ of the frequency divider $q_m$. The phase comparator 3 outputs the signal SG4 based on the phase difference between the reference signal SG2 and the signal SG3 generated and output by the comparison frequency divider 6.

The phase lock detecting circuit 100 is composed of a two-input AND circuit 7, an inverter 8, a D-type flip-flop 9, an RS-type flip-flop 10, a two-input OR circuit 11 and a two-input AND circuit 12. The signal SG4 generated and output by the phase comparator 3 is applied to one of the two input terminals of the AND circuit 7, and the output signal SG$q_k+1$ of the frequency divider $q_k+1$ is applied to the other input terminal of the AND circuit 7. Thus, as shown in FIG. 5, when the signal SG4 from the phase comparator 3 has a pulse width greater than that of the output signal SG$q_k+1$ of the frequency divider $q_k+1$, the AND circuit 7 outputs a signal SG8 having a high level. The signal SG8 thus generated is input to a terminal D of the D-type flip-flop 9.

The D-type flip-flop 9 is supplied with, as a clock signal, the output signal SG$q_k$ of the frequency divider $q_k$. The D-type flip-flop 9 generates a signal SG9 from the clock signal as well as the signal SG8 from the AND circuit 7, as shown in FIG. 5. That is, the output signal SG9 rises when the signal SG$q_k$ output from the frequency divider $q_k$ falls in a state where the signal SG8 from the AND circuit 7 is at the high level, and falls in response to the next fall of the signal SG$q_k$. The signal SG9 thus generated is drawn from a terminal Q of the D-type flip-flop 9 and then input to a terminal S of the RS-type flip-flop 10.

The RS-type flip-flop 10 outputs, as a phase unlock detection signal, a signal SG10 at the high level in accordance with the high-level output signal SG9. When the high-level signal SG10 is generated, the oscillation frequency of the voltage-controlled oscillator 5 is out of the phase-locked state (in the phase-unlocked state). As the phase and frequency of the signal SG3 output by the comparison frequency divider 6 become close to those of the signal SG2 output by the reference frequency divider 2 due to the function of the PLL synthesizer circuit, the pulse width of the signal SG4 output by the phase comparator 3 decreases. Then, the output signal SG10 of the RS-type flip-flop 10 is switched to the low level and the PLL synthesizer circuit is restored to the phase locked state. A signal SG11 for resetting the RS-type flip-flop 12 is generated by the AND circuit 12, which receives the output signals of the frequency dividers $q_{n-1}$ and $q_n$. The OR circuit 11 receives the signal SG9 and an inverted version of the signal SG10, and outputs an OR operation result thereon to the frequency dividers $q_{n-1}$ and $q_n$. The pulse width of the signal SG10 is defined by the signal SG11. It is possible to adjust the pulse width of the signal SG10 by supplying the AND circuit 12 with the signals of different frequency dividers.

It should be noted that the waveform diagram of FIG. 5 is illustrated without taking into account an operational delay time caused by the frequency dividers q1–qn connected in series. A slight delay time takes place until each of the frequency dividers starts to operate in response to the output signal of the immediately previous frequency divider. Such a slight delay time is accumulated. An accumulated delay time causes the following problems. As shown in FIG. 6, if there is a slight delay time t between the signal SGqk of the frequency divider qk and the signal SGqm of the frequency divider qm, the phase comparator 3 outputs the signal SG4 having a small pulse width. In the case where the signal SG10 maintained at the low level is output, as the phase lock detection signal, from the RS-type flip-flop 10, there is a possibility that the signal SG4 having a small pulse width passes through the AND circuit 7, and is output as it is, as the signal SG8. Then, the signal SG8 having the small pulse width causes the D-type flip-flop 9 to output the high-level signal SG9. Thus, the RS-type flip-flop 10 outputs the high-level signal SGIO, as the phase unlock detection signal irrespective of whether or not the PLL synthesizer circuit is in the phase-locked state. The signal SG10 is used, for example, in a communication device capable of communicating with another party at an arbitrary frequency. When the phase unlock detection signal is generated irrespective of whether or not the PLL synthesizer circuit is correctly in the phase-locked state, the established communication channel will be destroyed.

SUMMARY OF THE PRESENT INVENTION

It is a general object of the present invention to provide an improved PLL synthesizer circuit having an improved circuit capable of correctly detecting the state of the PLL synthesizer circuit by detecting the pulse width of a signal indicative of the phase difference between the reference frequency and the oscillation frequency of the PLL synthesizer circuit.

The above-mentioned object of the present invention is achieved by a PLL synthesizer circuit comprising:

reference frequency generating means for generating a reference frequency signal and a reference clock signal;

phase comparing means for comparing a phase of the reference frequency signal with an output signal and for outputting a phase difference signal having a pulse form;

voltage-controlled oscillation means, coupled to the phase comparing means, for generating the output signal having a frequency dependent on the phase difference signal; and phase lock detecting means, coupled to the phase comparing means, for determining whether or not the phase difference signal has a pulse width in which the reference clock signal successively changes n times (n is a numeral equal to or greater than 2) and for outputting a phase lock detection signal representing that the PLL synthesizer circuit is in a phase-locked state when it is determined that the reference clock signal does not successively change n times in the pulse width of the phase difference signal.

BRIEF DESCRIPTION OF THE DRAWINGS

Other objects, features and advantages of the present invention will become more apparent from the following detailed description when read in conjunction with the accompanying drawings, in which:

FIG. 10 is a waveform diagram illustrating the operation of the phase lock detecting circuit shown in FIG. 9;

DESCRIPTION OF THE PREFERRED EMBODIMENTS

Figure 7:
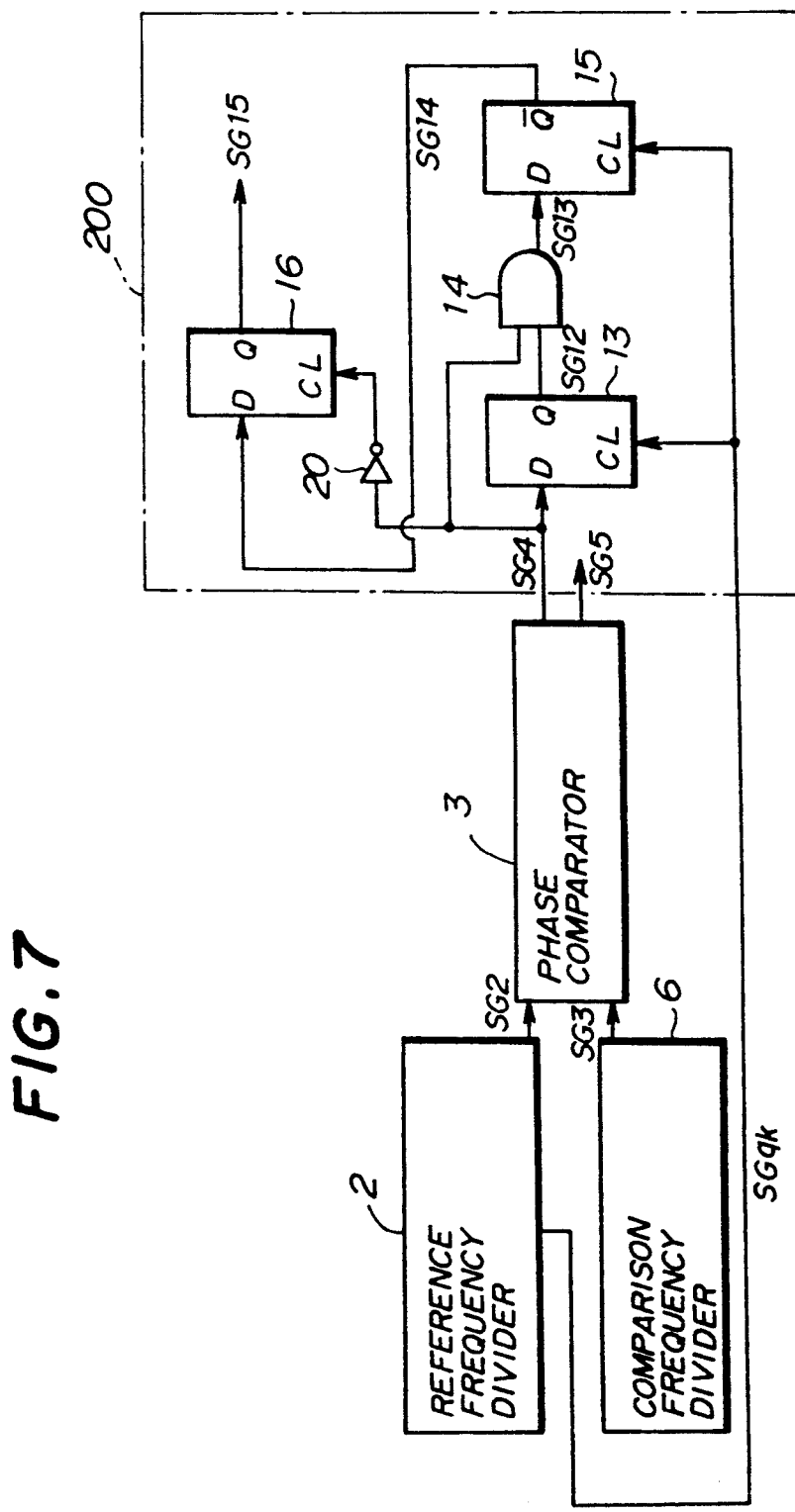
FIG. 7 is a block diagram of a PLL synthesizer circuit having a pulse width detecting circuit according to a first preferred embodiment of the present invention in which the pulse width detecting circuit is applied for a PLL synthesizer circuit and serves as a phase lock detecting circuit.

Referring to FIG. 7, there is illustrated a pulse width detecting circuit according to a first preferred embodiment of the present invention. The pulse width detecting circuit shown in FIG. 7 serves as a phase lock detecting circuit. In FIG. 7, those parts which are the same as those shown in the previous figures are given the same reference numerals. A phase lock detecting circuit 200 is composed of a D-type flip-flop 13, a two-input AND circuit 14, a D-type flip-flop 15, a D-type flip-flop 16, and an inverter 20.

The phase comparator 3 outputs the signals SG4 and SG5 having the pulse widths which vary in accordance with the phase difference between the signals SG2 and SG3. The signal SG4 is input to a terminal D of the D-type flip-flop 13, one of the two input terminals of the AND circuit 14, and the inverter 20. An output signal SG12 obtained at a terminal Q of the D-type flip-flop 13 is input to the other input terminal of the AND circuit 14, which generates a signal SG13. An output terminal of the AND circuit 14 is connected to a terminal D of the flip-flop 15 which outputs a signal SG14. An output terminal Q of the D-type flip-flop 15 is connected to a terminal D of the D-type flip-flop 16. A reference clock signal SGqk generated by the reference frequency divider 2 is applied to clock terminals CL of the D-type flip-flops 13 and 15. A clock terminal CL of the D-type flip-flop 16 is supplied with an inverted version of the signal SG4 generated by the inverter 20. The D-type flip-flop 16 outputs a phase lock detection signal SG15 (which also functions as a phase unlock detection signal) via a terminal Q thereof.

Figure 8:
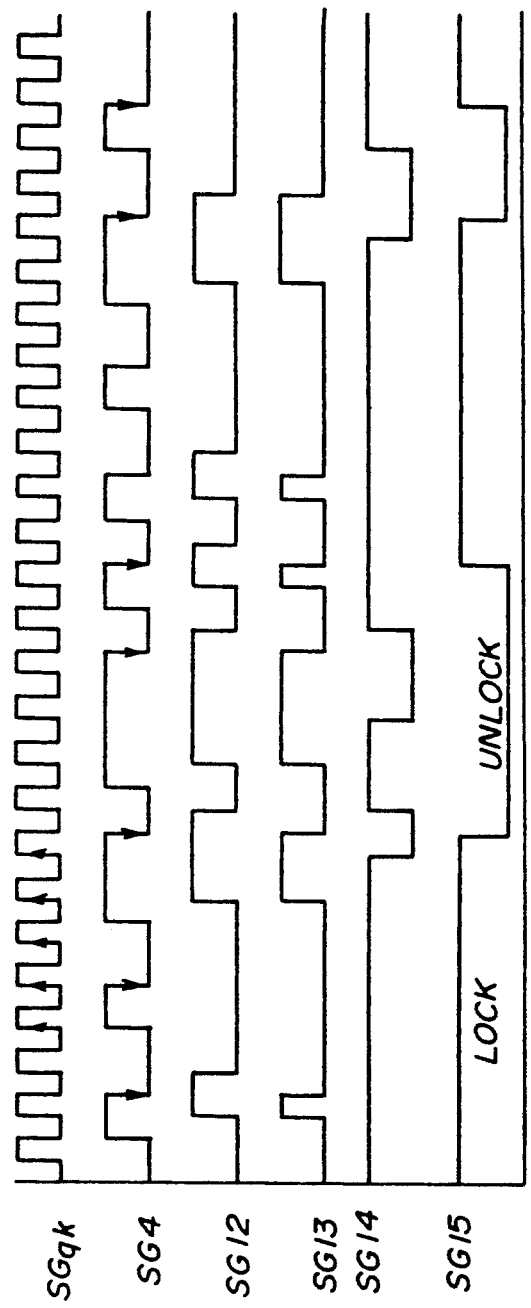
FIG. 8 is a waveform diagram illustrating the operation of the phase lock detecting circuit shown in FIG. 7.

FIG. 8 is a waveform diagram illustrating the operation of the phase lock detecting circuit shown in FIG. 7. The D-type flip-flop 13 and 15 respectively latch the corresponding input signals in synchronism with the rise of the reference clock signal SGqk generated by the reference frequency divider 2. A signal SG13 output by the AND circuit 14 has a pulse width in which the pulse width of the signal SG4 and the pulse width of a signal SG12 output by the D-type flip-flop 13 overlap with each other. The D-type flip-flop 15 changes an output signal SG14 obtained at an output terminal $\overline{Q}$ thereof from a high level to a low level when the reference clock signal SGqk rises in a state where the signal SG13 output by the AND circuit 14 is maintained at the high level. In other words, the signal SG14 falls when the signal SG13 is continuously maintained at the high level during a time when the reference clock signal SGqk rises twice. The D-type flip-flop 16 latches the signal SG14 when the signal SG4 falls. In the above-mentioned way, when the signal SG4 has a pulse width in which the reference clock signal SGqk rises twice, the phase lock detecting circuit 200 outputs the low-level signal SG15 which indicates that the PLL synthesizer is in the phase-unlocked state.

Figure 9:
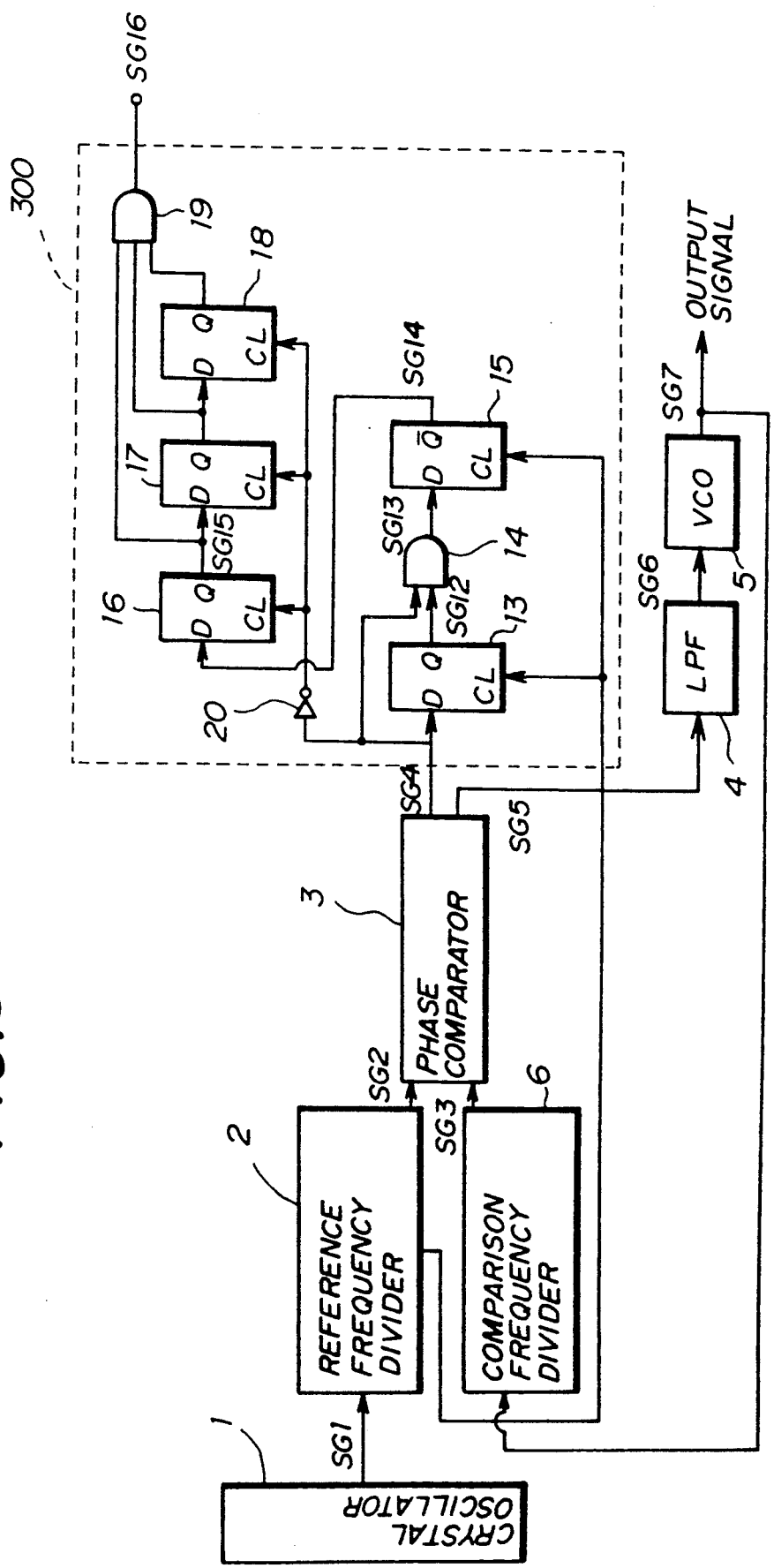
FIG. 9 is a block diagram illustrating a PLL synthesizer circuit having a phase lock detecting circuit according to a second preferred embodiment of the present invention.

FIG. 9 illustrates a PLL synthesizer circuit having a phase lock detecting circuit 300 according to a second preferred embodiment of the present invention. In FIG. 9, those parts which are the same as those shown in FIG. 7 are given the same reference numerals. The phase lock detecting circuit 300 includes two D-type flip-flops 17 and 18, and a three-input AND circuit 19 in addition to the phase lock detecting circuit 200 shown in FIG. 7. The terminal Q of the D-type flip-flop 16 is connected to a terminal D of the D-type flip-flop 17 and one of the three input terminals of the AND circuit 19. A terminal Q of the D-type flip-flop 17 is connected to a terminal D of the D-type flip-flop 18 and one of the three input terminals of the AND circuit 19. A terminal Q of the D-type flip-flop 18 is connected to one of the three input terminals of the AND circuit 19. The inverted version of the signal SG4 output by the phase comparator 3 is applied to clock terminals CL of the D-type flip-flops 16–18.

Figure 1:
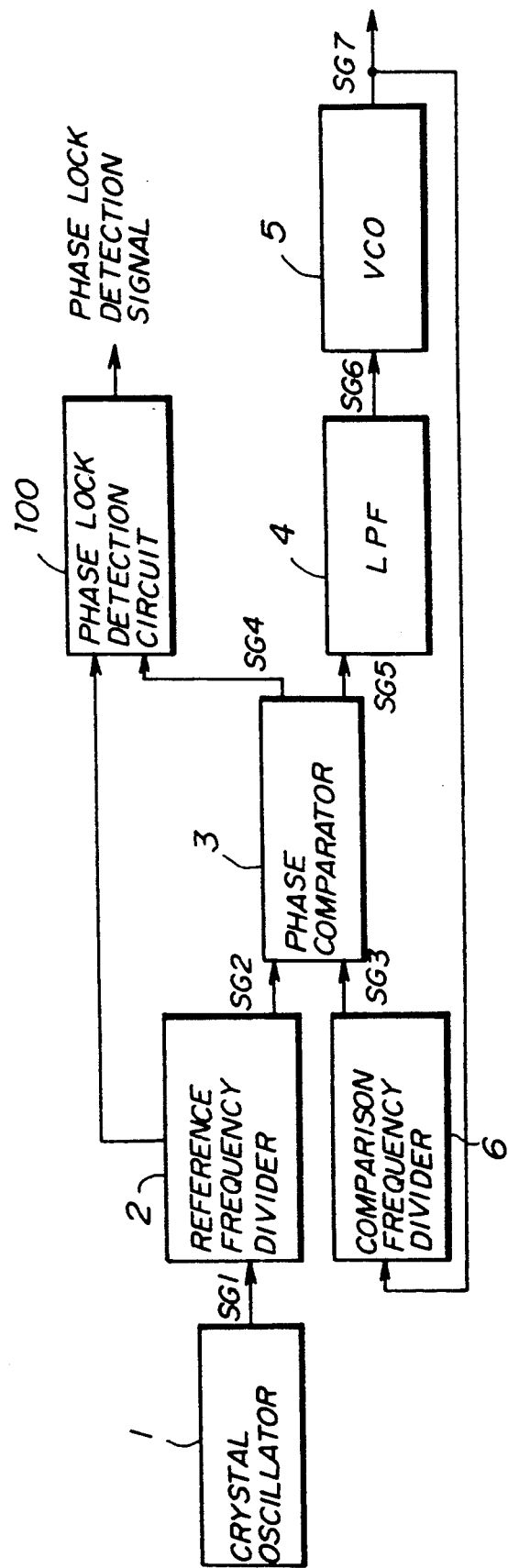
FIG. 1 is a block diagram of a prior art PLL synthesizer circuit.
Figure 2:
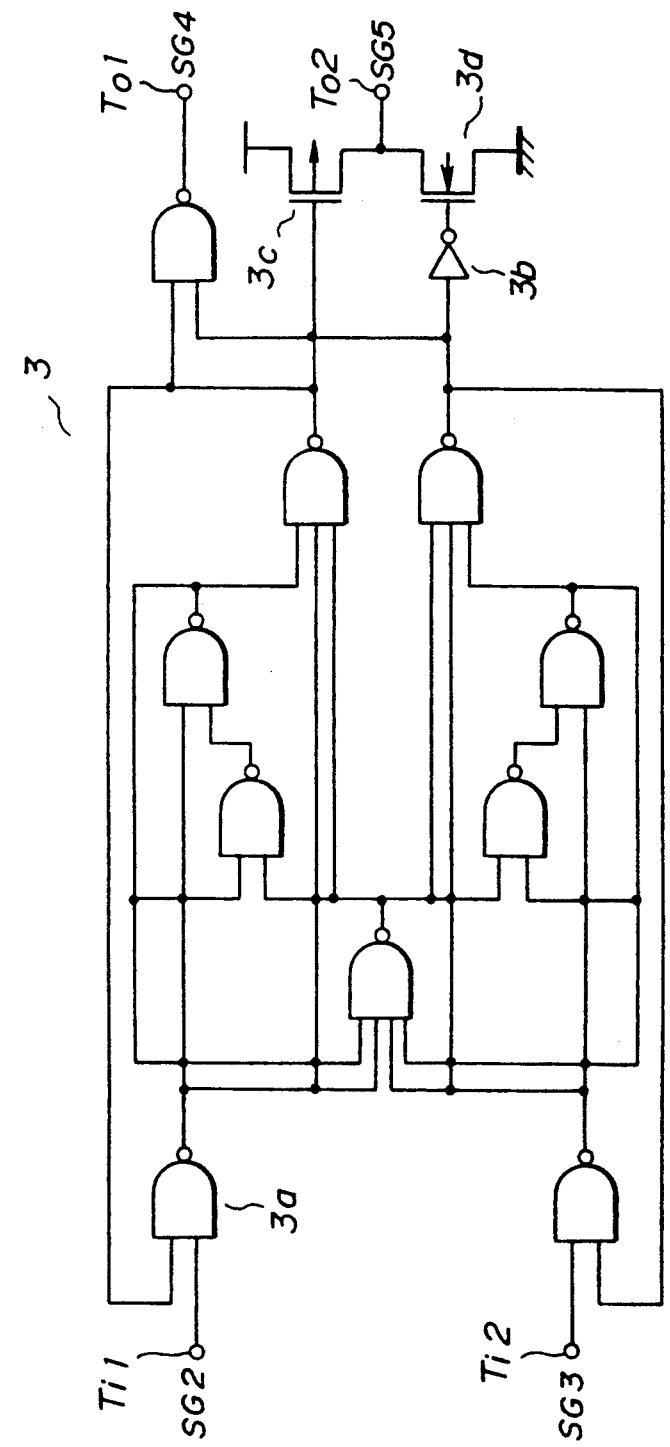
FIG. 2 is a circuit diagram of a prior art phase comparator shown in FIG. 1.
Figure 3:
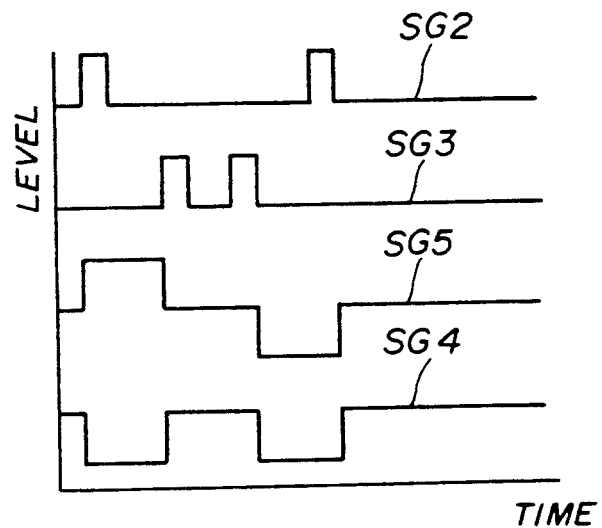
FIG. 3 is a waveform diagram illustrating the operation of the phase comparator shown in FIG. 2.
Figure 11:
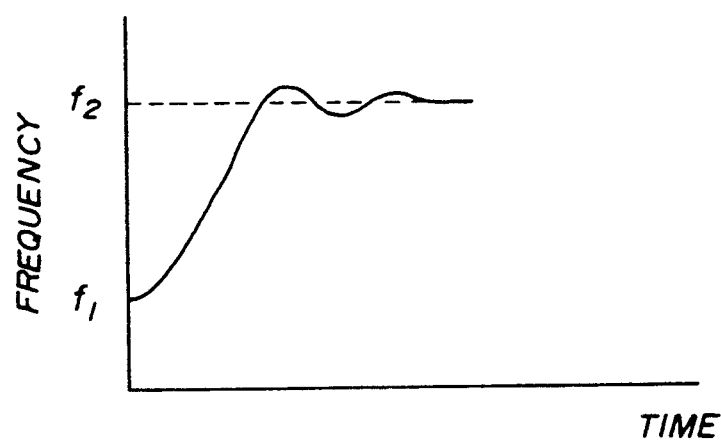
FIG. 11 is a graph illustrating a change of the oscillation frequency of the PLL synthesizer as a function of time.
Figure 4:
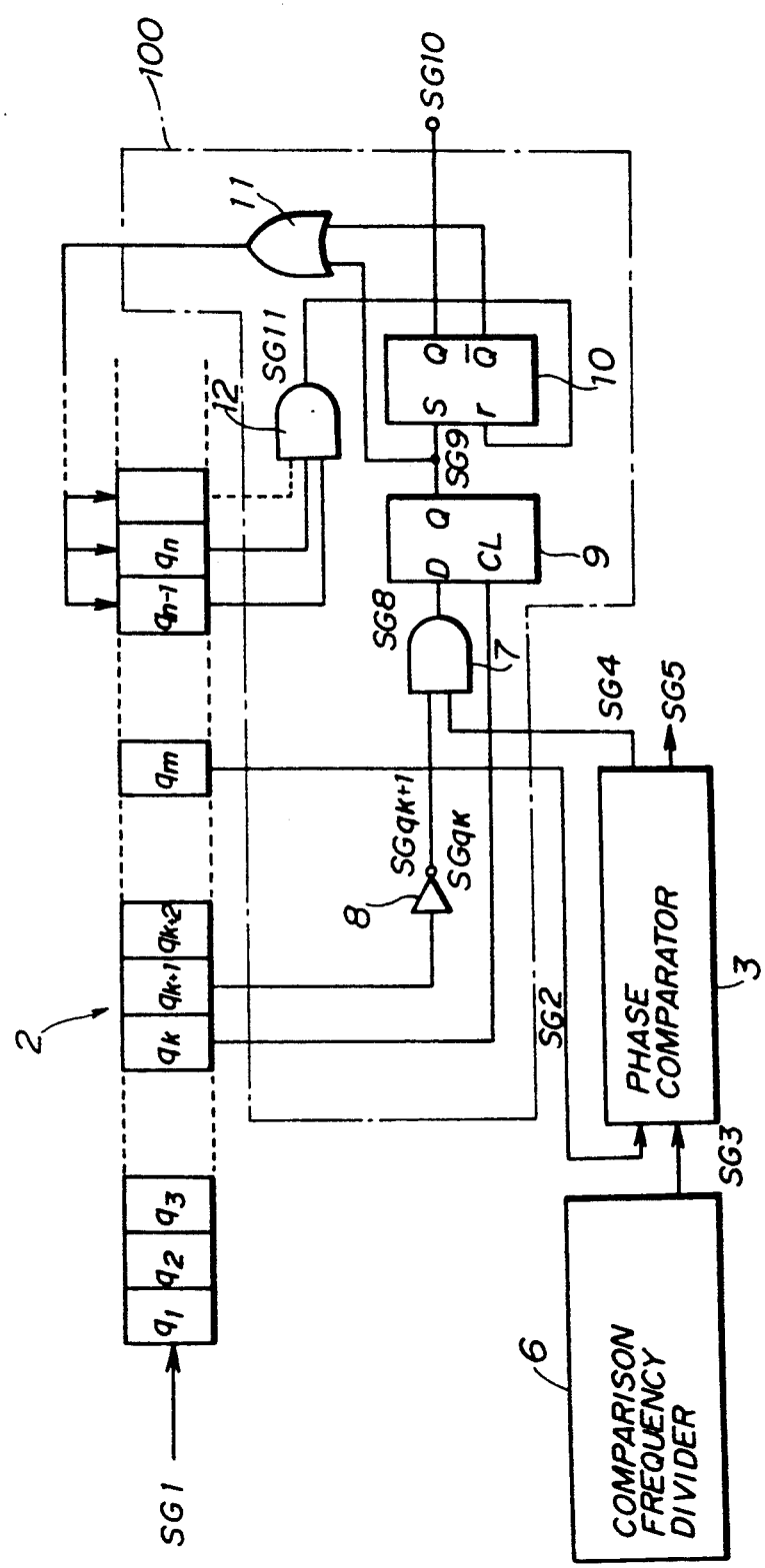
FIG. 4 is a block diagram illustrating a conventional phase lock detecting circuit shown in FIG. 1.
Figure 5:
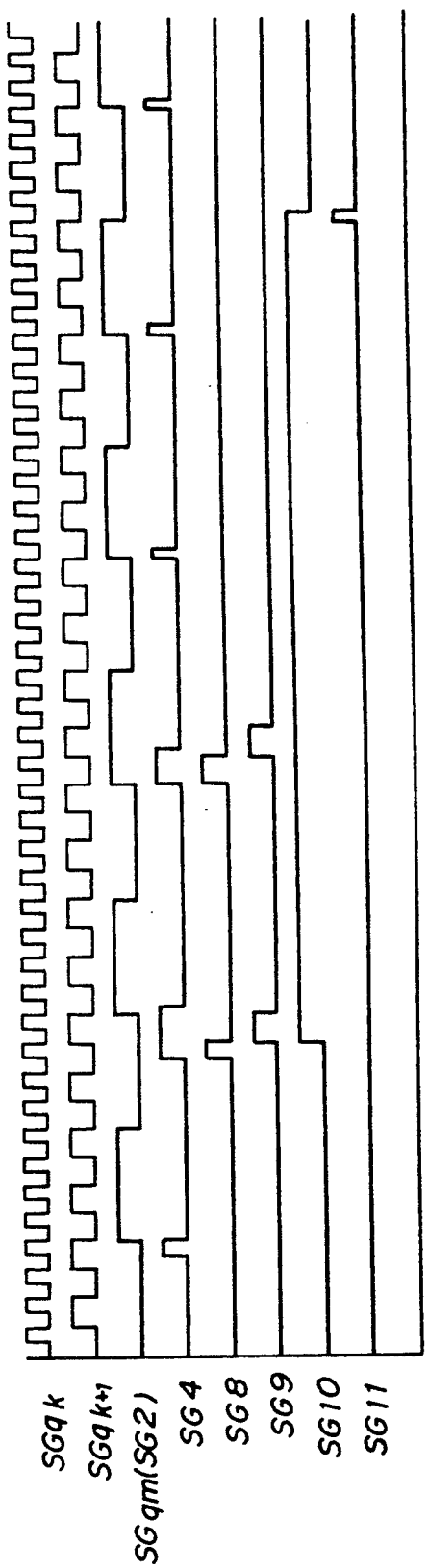
FIG. 5 is a waveform diagram illustrating the operation of the configuration shown in FIG. 4 in which an operational delay time caused by a reference frequency divider shown in FIG. 4 is neglected.
Figure 6:
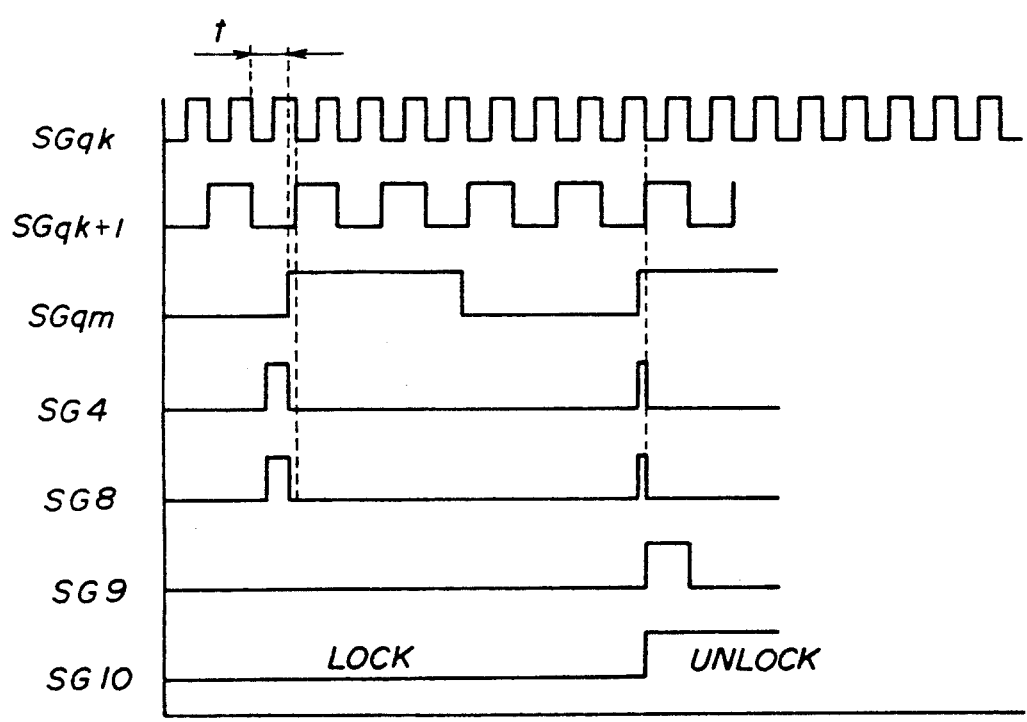
FIG. 6 is a waveform diagram illustrating the operation of the configuration shown in FIG. 4 in which the operational delay time caused by the reference frequency divider shown in FIG. 4 is taken into account.

During operation, when the signal SG4 shown in FIG. 10 is input to the phase lock detecting circuit 300, the D-type flip-flop 13 outputs the signal SG12 generated from the signal SG4 and the reference clock signal SGqk to the AND circuit 14. Then, the AND circuit 14 outputs the signal SG13 generated from the signal SG12 and the signal SG4 to the D-type flip-flop 15. The D-type flip-flop 15 outputs the signal SG14 from the signal SG13 and the reference clock signal SGqk to the D-type flip-flop 16. The D-type flip-flops 16, 17 and 18, and the AND circuit 19 functions to change a lock detection signal SG16 from a low level to a high level when the signal SG14 output by the D-type flip-flop 15 is continuously at the high level during a time when the signal SG4 output by the phase comparator 3 successively falls three times. In other words, when the phase lock detection signal is successively output three times in synchronism with the inverted version of the signal SG4, it is concluded that the PLL synthesizer is definitely in the phase locked state. This arrangement is taken into account in a case as shown in FIG. 11. When the PLL synthesizer circuit changes its oscillation frequency from f1 to f2, a ringing of the oscillation frequency may initially occur. The combination of the D-type flip-flops 16–18 and the AND circuit 19 makes it possible to generate the lock detection signal when the initial ringing decreases sufficiently.

As described above, by adding two D-type flip-flops 17 and 18, and the AND circuit 19, the phase lock detecting circuit 300 determines whether or not the phase lock detection signal is successively output three times. It is also possible to provide m flip-flops (m is arbitrarily equal to or greater than 2) and a single AND circuit for the above-mentioned purpose.

Figure 12:
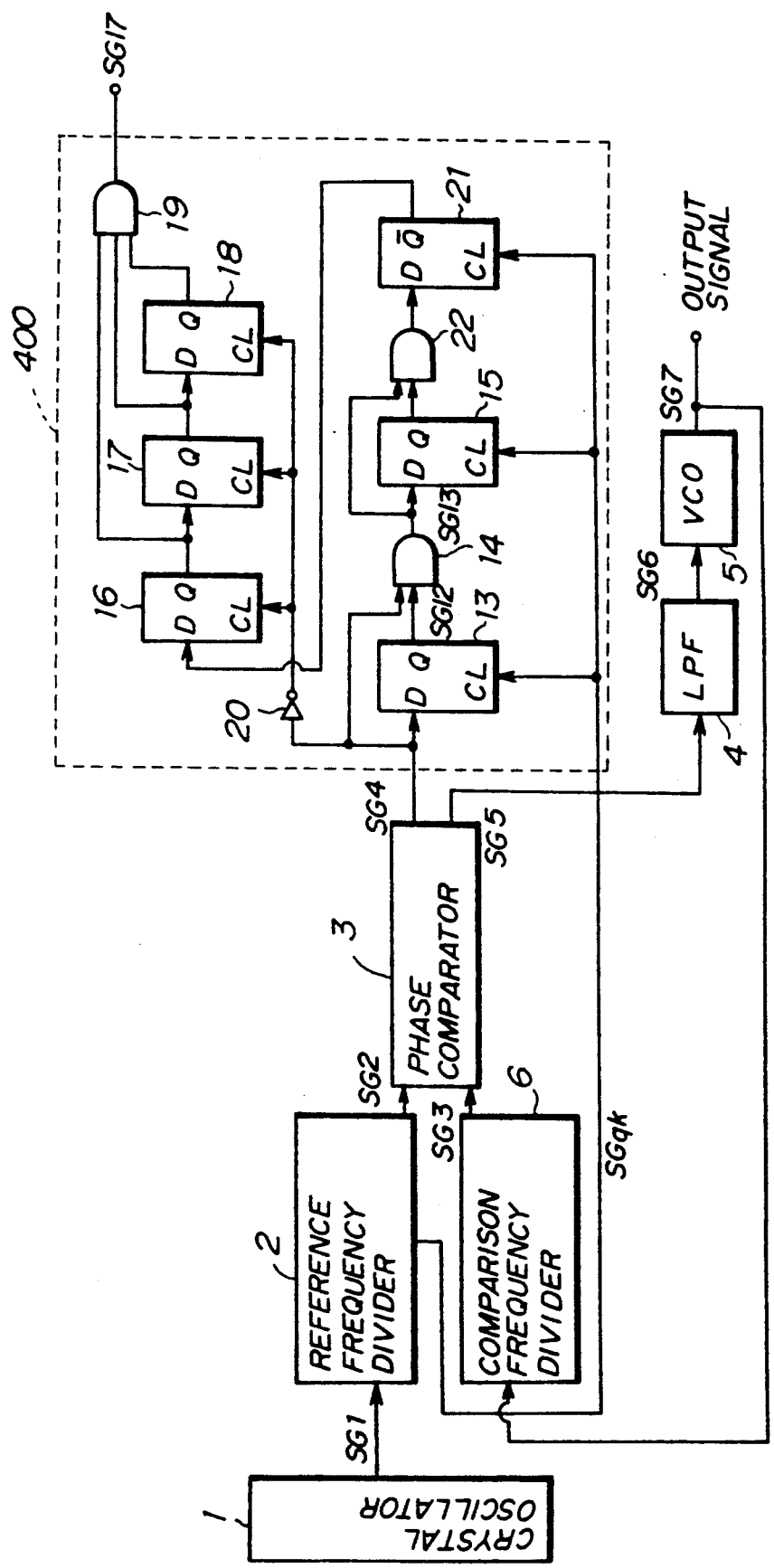
FIG. 12 is a block diagram illustrating a PLL synthesizer circuit having a phase lock detecting circuit according to a third preferred embodiment of the present invention.

Referring to FIG. 12, there is illustrated a PLL synthesizer circuit having a phase lock detecting circuit 400 according to a third preferred embodiment of the present invention. In FIG. 12, those parts which are the same as those shown in FIG. 9 are given the same reference numerals. The phase lock detecting circuit 400 is configured by adding an AND circuit 22 and a D-type flip-flop 21 to the phase lock detection circuit 300 shown in FIG. 9. The terminal Q of the D-type flip-flop 15 is connected to one of the two input terminals of the AND circuit 22. The other input terminal of the AND circuit 22 is supplied with the signal SG13. An output terminal of the AND circuit 22 is connected to a terminal D of the D-type flip-flop 21 A terminal $\overline{Q}$ of the D-type flip-flop 21 is connected to the terminal D of the D-type flip-flop 16. The reference clock signal SGqk generated by the reference frequency divider 2 is applied to a clock terminal CL of the D-type flip-flop 21. The AND circuit 19 outputs a phase lock detection signal SG17.

The combination of the D-type flip-flops 13, 15 and 21, and the AND circuits 14 and 22 function to detect a pulse width of the signal SG4 in which the reference clock signal SGqk successively rises three times. Thus, the phase lock detecting circuit 400 detects a wider frequency locking range than that detected by the phase lock detecting circuit 200 shown in FIG. 7.

The above-mentioned embodiments of the present invention check the pulse width of the phase difference signal SG4 two or three times in synchronism with the reference clock signal SGqk. It is also possible to check the pulse width of the phase difference signal SG4 four or more times. As the frequency of the reference clock signal SGqk increases, it is sufficient to detect the same pulse width by checking the pulse width of the phase difference signal a smaller number of times.

The present invention is not limited to the specifically disclosed embodiments, and variations and modifications may be made without departing from the scope of the present invention.

What is claimed is:

1. A PLL synthesizer circuit comprising:
   reference frequency generating means for generating a reference frequency signal and a reference clock signal;
   phase comparing means for comparing a phase of said reference frequency signal with an output signal and for outputting a phase difference signal having a pulse form;
   voltage-controlled oscillation means, coupled to said phase comparing means, for generating said output signal having a frequency dependent on said phase difference signal; and
   phase lock detecting means, coupled to said phase comparing means, for determining whether or not said phase difference signal has a pulse width in which said reference clock signal successively changes n times (n is a numeral equal to or greater than 2) and for outputting a phase lock detection signal representing that said PLL synthesizer circuit is in a phase-locked state when it is determined that said reference clock signal does not successively change n times in said pulse width of said phase difference signal, said phase lock detecting means including:

first, second and third flip-flops, each having an input terminal, an output terminal and a clock terminal;

a first AND circuit having a first input terminal, a second input terminal and an output terminal; and an inverter, and wherein:

the input terminal of said first flip-flop receives said phase difference signal;

the output terminal of said first flip-flop is connected to the first input terminal of said first AND circuit;

the second input terminal of said first AND circuit receives said phase difference signal;

the output terminal of said first AND circuit is connected to the input terminal of said second flip-flop;

said reference clock signal is supplied to said clock terminal of each of said first and second flip-flops;

the output terminal of said second flip-flop is connected to the input terminal of said third flip-flop;

the clock terminal of said third flip-flop receives an inverted version of said phase difference signal generated by said inverter; and said phase lock detection signal is output via the output terminal of said third flip-flop.

2. A PLL synthesizer circuit as claimed in claim 1, wherein:

said first, second and third flip-flops are respectively formed of D-type flip-flops;

each of said first and third D-type flip-flops has an output terminal Q serving as the output terminal of each of said first and third flip-flops; and said second D-type flip-flop has an inverted terminal $\overline{Q}$ serving as the output terminal of said second flip-flop.

3. A pulse width detecting circuit comprising:

an input terminal; and pulse width detecting means for determining whether or not a pulse signal applied to said input terminal has a predetermined pulse width in which a reference clock signal successively changes n times (n is a numeral equal to or greater than 2) and for outputting a pulse width detection signal indicating that said pulse signal has said predetermined pulse width when it is determined that said reference clock signal successively changes n times within said pulse width of said pulse signal, said pulse width detecting means including:

first, second and third flip-flops, each having an input terminal an output terminal and a clock terminal;

an AND circuit having a first input terminal, a second input terminal and an output terminal; and an inverter, and wherein:

the input terminal of said first flip-flop receives said pulse signal;

the output terminal of said first flip-flop is connected to the first input terminal of said AND circuit;

the second input terminal of said AND circuit receives said pulse signal;

the output terminal of said AND circuit is connected to the input terminal of said second flip-flop;

said reference clock signal is supplied to said clock terminal of each of said first and second flip-flops;

the output terminal of said second flip-flop is connected to the input terminal of said third flip-flop;

the clock terminal of said third flip-flop receives an inverted version of said pulse signal generated by said inverter; and said pulse width detection signal is output via the output terminal of said third flip-flop.

4. A pulse width detecting circuit as claimed in claim 3, wherein:

said first, second and third flip-flops are respectively formed of D-type flip-flops;

each of said first and third D-type flip-flops has an output terminal Q serving as the output terminal of each of said first and third flip-flops; and said second D-type flip-flop has an inverted terminal $\overline{Q}$ serving as the output terminal of said second flip-flop.

5. A PLL synthesizer circuit comprising:

reference frequency generating means for generating a reference frequency signal and a reference clock signal;

phase comparing means for comparing a phase of said reference frequency signal with an output signal and for outputting a phase difference signal having a pulse form;

voltage-controlled oscillation means, coupled to said phase comparing means, for generating said output signal having a frequency dependent on said phase difference signal; and phase lock detecting means, coupled to said phase comparing means, for determining whether or not said phase difference signal has a pulse width in which said reference clock signal successively changes n times (n is a numeral equal to or greater than 2) and for outputting a phase lock detection signal representing that said PLL synthesizer circuit is in a phase-locked state when it is determined that said reference clock signal does not successively change n times in said pulse width of said phase difference signal, said phase lock detecting means including:

decision mean for determining whether or not said phase lock detection signal is successively generated a predetermined number of times in synchronism with a change of said phase difference signal and for outputting a finalized phase lock detection signal indicating that said PLL synthesizer circuit is definitely in the phase-locked state when it is determined said phase lock detection signal is successively generated said predetermined number of times.

6. A PLL synthesizer circuit as claimed in claim 5, wherein said decision means comprises m (m is an integer equal to or greater than 2) flip-flops connected in series, and an AND circuit, wherein:
- each of said m flip-flops has an input terminal, an output terminal and a clock terminal;
- the input terminal of one of said m flip-flops at a first stage is connected to receive said phase lock detection signal;
- the output terminal of each of said m flip-flops is connected to said AND circuit;
- an inverted version of said phase difference signal is applied to the clock terminal of each of said m flip-flops;
- a finalized phase lock detection signal indicating that said PLL synthesizer circuit is definitely in the phase-locked state is output via said AND circuit; and
- an input terminal of each of said m flip-flops is connected to an output terminal of a previous stage flip-flop.

7. A PLL synthesizer circuit as claimed in claim 6, wherein said m flip-flops are respectively formed of D-type flip-flops.

8. A PLL synthesizer circuit comprising:
- reference frequency generating means for generating a reference frequency signal and a reference clock signal;
- phase comparing means for comparing a phase of said reference frequency signal with an output signal and for outputting a phase difference signal having a pulse form;
- voltage-controlled oscillation means, coupled to said phase comparing means, for generating said output signal having a frequency dependent on said phase difference signal; and
- phase lock detecting means, coupled to said phase comparing means, for determining whether or not said phase difference signal has a pulse width in which said reference clock signal successively changes n times (n is a numeral equal to or greater than 2) and for outputting a phase lock detection signal representing that said PLL synthesizer circuit is in a phase-locked state when it is determined that said reference clock signal does not successively change n times in said pulse width of said phase difference signal, said phase lock detecting means including:
  - first, second, third and fourth flip-flops, each having an input terminal, an output terminal and a clock terminal;
  - first and second AND circuits, each having a first input terminal, a second input terminal and an output terminal; and
  - an inverter, and wherein:
    - the input terminal of said first flip-flop receives said phase difference signal;
    - the output terminal of said first flip-flop is connected to the first input terminal of said first AND circuit;
    - the second input terminal of said first AND circuit receives said phase difference signal;
    - the output terminal of said first AND circuit is connected to the input terminal of said second flip-flop;
    - the first and second input terminals of said second AND circuit are connected to the output terminal of said first AND circuit and the output terminal of said second flip-flop, respectively;
    - said reference clock signal is supplied to said clock terminal of each of said first, second and third flip-flops;
    - the output terminal of said third flip-flop is connected to the input terminal of said fourth flip-flop and the input terminal of said third flip-flop is operatively connected to the output terminal of said second flip-flop by way of said second AND circuit;
    - the clock terminal of said fourth flip-flop receives an inverted version of said phase difference signal generated by said inverter; and
    - said phase lock detection signal is output via the output terminal of said fourth flip-flop.

9. A PLL synthesizer circuit as claimed in claim 8, wherein said phase lock detecting means comprises decision means for determining whether or not said phase lock detection signal is successively generated a predetermined number of times in synchronism with a change of said phase difference signal and for outputting a finalized phase lock detection signal indicating that said PLL synthesizer circuit is definitely in the phase-locked state when it is determined said phase lock detection signal is successively generated said predetermined number of times.

10. A PLL synthesizer circuit as claimed in claim 8, wherein said first, second, third and fourth flip-flops are respectively formed of D-type flip-flops.

11. A PLL synthesizer circuit comprising:
- reference frequency generating means for generating a reference frequency signal and a reference clock signal;
- phase comparing means for comparing a phase of said reference frequency signal with an output signal and for outputting a phase difference signal having a pulse form;
- voltage-controlled oscillation means, coupled to said phase comparing means, for generating said output signal having a frequency dependent on said phase difference signal; and
- phase lock detecting means, coupled to said phase comparing means, for determining whether or not said phase difference signal has a pulse width in which said reference clock signal successively changes n times (n is a numeral equal to or greater than 2) and for outputting a phase lock detection signal representing that said PLL synthesizer circuit is in a phase-locked state when it is determined that said reference clock signal does not successively change n times in said pulse width of said phase difference signal, said phase lock detection signal has a first level obtained when it is determined that said reference clock signal does not successively change n times in said pulse width of said phase difference signal, and a second level obtained when it is determined that said reference clock signal successively changes n times in said pulse width, said first level indicating that said PLL synthesizer circuit is in the phase-locked state, and said second level indicating that said PLL synthesizer circuit is in a phase-unlocked state.

12. A pulse width detecting circuit comprising:
- an input terminal; and
- pulse width detecting means for repeatedly determining whether or not a pulse signal applied to said input terminal changes during a time when a reference clock signal successively changes n times (n is a numeral equal to or greater than 2) and for generating a pulse width detection signal indicating a change in a period of said pulse signal applied to said input terminal on the basis of whether or not the reference clock signal successively changes n times, said pulse width detecting means including:
decision means for determining whether or not said pulse width detection signal is successively generated a predetermined number of times in synchronism with a change of said pulse signal and for outputting a finalized pulse width detection signal indicating that said pulse signal definitely has a predetermined pulse width when it is determined said pulse width detection signal is successively generated said predetermined number of times.

13. A pulse width detecting circuit as claimed in claim 12, wherein said decision means comprises m (m is an integer equal to or greater than 2) flip-flops connected in series, and an AND circuit, wherein:
each of said m flip-flops has an input terminal, an output terminal and a clock terminal;
the input terminal of one of said m flip-flops at a first stage is connected to receive said pulse width detection signal;
the output terminal of each of said m flip-flops is connected to said AND circuit;
an inverted version pulse signal is applied to the clock terminal of each of said m flip-flops; and
said finalized pulse width detection signal indicating that said pulse width detecting means definitely has said predetermined pulse width is output via and AND circuit.

14. A pulse width detecting circuit as claimed in claim 13, wherein said m flip-flops are respectively formed of D-type flip-flops.

15. A pulse width detecting circuit, comprising: an input terminal; and
pulse width detecting means for repeatedly determining whether or not a pulse signal applied to said input terminal changes during a time when a reference clock signal successively changes n times (n being a numeral greater than or equal to 2) and for generating a pulse width detection signal indicating a change in a period of the pulse signal applied to said input terminal on the basis of whether or not the reference clock signal successively changes n times, said pulse width detecting means including;
first, second, third and fourth flip-flops, each having an input terminal, an output terminal and a clock terminal;
first and second AND circuits, each having a first input terminal, a second input terminal and an output terminal, and
an inverter, and wherein;
the input terminal of said first flip-flop receives said pulse signal;
the output terminal of said first flip-flop is connected to the first input terminal of said first AND circuit;
the second input terminal of said first AND circuit receives said pulse signal;
the output terminal of said first AND circuit is connected to the input terminal of said second flip-flop;
the first and second input terminals of said second AND circuit are connected to the output terminal of said first AND circuit and the output terminal of said second flip-flop, respectively;
said reference clock signal is supplied to said clock terminal of each of said first, second and third flip-flops;
the output terminal of said third flip-flop is connected to the input terminal of said fourth flip-flop and the input terminal of said third flip-flop is operatively connected to the output terminal of said second flip-flop by way of said second AND circuit;
the clock terminal of said fourth flip-flop receives an inverted version of said pulse signal generated by said inverter; and
said pulse width detection signal is output via the output terminal of said fourth flip-flop.

16. A pulse width detecting circuit as claimed in claim 15, wherein said pulse width detecting means comprises decision means for determining whether or not said pulse width detection signal is successively generated a predetermined number of times in synchronism with a change of said pulse signal and for outputting a finalized pulse width detection signal indicating that said pulse signal definitely has a predetermined pulse width when it is determined said pulse width detection signal is successively generated said predetermined number of times.

17. A pulse width detecting circuit as claimed in claim 15, wherein said first, second, third and fourth flip-flops are respectively formed of D-type flip-flops.

* * * * *

UNITED STATES PATENT AND TRADEMARK OFFICE
CERTIFICATE OF CORRECTION

PATENT NO. : 5,189,379
DATED : February 23, 1993
INVENTOR(S) : Shinji Saito, et. al.

It is certified that error appears in the above-indentified patent and that said Letters Patent is hereby corrected as shown below:

On the Title page, item [73], Assignee: after "Japan", insert --Fujitsu VLS1 Limited, Kasugai, Japan--.
Col. 6, line 26, "21 A" should be --21. A--.
Col. 8, line 57, "mean" should be --means--.
Col. 11, line 31, "and" should be --the--.

Signed and Sealed this

Thirtieth Day of August, 1994

Attest:

BRUCE LEHMAN

Attesting Officer     Commissioner of Patents and Trademarks